(12) United States Patent
Chen

(10) Patent No.: US 12,063,859 B2
(45) Date of Patent: Aug. 13, 2024

(54) DEVICE OF APPLICATION OF A COLD SURFACE OF THERMOELECTRIC COOLING CHIP

(71) Applicant: Kuan Hung Chen, New Taipei (TW)

(72) Inventor: Kuan Hung Chen, New Taipei (TW)

( * ) Notice: Subject to any disclaimer, the term of this patent is extended or adjusted under 35 U.S.C. 154(b) by 0 days.

(21) Appl. No.: 17/823,240

(22) Filed: Aug. 30, 2022

(65) Prior Publication Data

US 2023/0329111 A1     Oct. 12, 2023

(30) Foreign Application Priority Data

Apr. 12, 2022   (TW) .................................. 111113795

(51) Int. Cl.
*H10N 10/13* (2023.01)
*H10N 10/80* (2023.01)

(52) U.S. Cl.
CPC ............. *H10N 10/13* (2023.02); *H10N 10/80* (2023.02)

(58) Field of Classification Search
None
See application file for complete search history.

(56) References Cited

U.S. PATENT DOCUMENTS

| 5,269,146 A * | 12/1993 | Kerner | ................... H10N 10/13 |
| | | | 62/3.62 |
| 2008/0078202 A1* | 4/2008 | Luo | ........................ H10N 10/13 |
| | | | 62/485 |

FOREIGN PATENT DOCUMENTS

DE     102019121113 A1 *  2/2021

* cited by examiner

*Primary Examiner* — Dustin Q Dam
(74) *Attorney, Agent, or Firm* — Wang Law Firm, Inc.

(57) ABSTRACT

A device of application of a cold surface of a thermoelectric cooling (TEC) chip, the device includes a cooling part, a plate coil, a pump, a reservoir and a pipeline, the cooling part is used for connecting to the cold surface of TEC chip, the pump transfers antifreeze to circulate through the cooling part, the plate coil and the reservoir. Due the cooling part and the plate coil have large heat exchange area and excellent thermal conductivities, the device according to the present invention immediately conducts the cold temperature of the cold surface of TEC chip on operation of the TEC chip, the cooling efficiency thereof meets the standards of vehicle air conditioners and other products, so that the device according to the present invention has extremely high industrial availability.

10 Claims, 12 Drawing Sheets

DEVICE OF APPLICATION OF A COLD SURFACE OF THERMOELECTRIC COOLING CHIP

CROSS-REFERENCE TO RELATED APPLICATION

This application claims the priority of Taiwanese patent application No. 111113795, filed on Apr. 12, 2022, which is incorporated herewith by reference.

BACKGROUND OF THE INVENTION

1. Field of the Invention

The present invention relates to a device of application of a thermoelectric cooling (TEC) chip, especially to a device of application of a cold surface of a TEC chip.

2. The Prior Arts

A TEC chip of application of thermoelectric effect is consisting essentially of two insulating ceramic substrates, and multiple sets of P-type and N-type Bismuth Telluride based thermoelectric material and conductive copper electrodes in series which are disposed between the two insulating ceramic substrates. When a current enters the thermoelectric material from the electrodes or enters the electrodes from the thermoelectric materials, endothermic and exothermic phenomena will be generated at the interfaces between dissimilar materials respectively, and cause temperatures at the two materials increasing and decreasing, respectively. The endothermic/exothermic amount and relative locations thereof may be determined by controlling the magnitude and the direction of the direct current. The TEC chip is not as good as the compressor system in coefficient of performance (COP), but the TEC chip has unique advantage in applications of requiring small size, no moving parts, low noise, light weight and precise temperature control. At present time, the applications of the TEC chip are rapidly growing in markets such as precision temperature control for optical communication, thermal cycling for biomedical and semiconductor process equipment, consumer small appliances.

Because interior space of vehicles are greater than those of electronic, communication, small appliances and other products, a cooling continuity requirement of the vehicle air conditioners are higher than those of the aforesaid products; that is, if an equipment using the cold surface of TEC chip can meet the cooling continuity requirement of the vehicle air conditioners, it can also meet the cooling requirements of the aforesaid products. FIG. 1 is a block diagram illustrating a conventional vehicle air conditioner of TEC chip. As shown in FIG. 1, a conventional vehicle air conditioner of TEC chip 1 includes a TEC chip 10, a cold surface module 11, a hot surface module 12, a pre-cooling tank 13, an evaporator 14, a water-in pump 15, a water-out pump 16, a fan 17, a heat dissipation device 18, a cold water pipeline 110 and a hot water pipeline 120. The TEC chip 10 has opposite a cold surface and a hot surface, the cold surface module 11 and the hot surface module 12 are respectively connected to the cold surface and the hot surface, the water-in pump 15 is disposed between the cold surface module 11 and the pre-cooling tank 13, the water-out pump 16 is disposed between the pre-cooling tank 13 and the evaporator 14, the fan 17 is disposed at a side of the evaporator 14, the cold water pipeline 110 communicates with the cold surface module 11, the pre-cooling tank 13, the evaporator 14, the water-in pump 15 and the water-out pump 16, and the hot water pipeline 120 communicates with the hot surface module 12 and the heat dissipation device 18.

After the TEC chip 10 of the conventional vehicle air conditioner of TEC chip 1 is powered on, a temperature of the hot surface increases and a temperature of the cold surface decreases, and the cold surface module 11 and the hot surface module 12 conduct the coldness of the cold surface and the heat of the hot surface, respectively. Due coldness conducting efficiency of the cold surface module 11 cannot immediately reduce a temperature of sufficient water to a low temperature required for generating cold air, it is needed to dispose the pre-cooling tank 13 of a volume about 10 liters between the cold surface module 11 and the evaporator 14. The water-in pump 15 circulates the water in the pre-cooling tank 13 to the cold surface module 11 through the cold water pipeline 110 for cooling. When the temperature of the water in the pre-cooling tank 13 is reduced to a predetermined temperature (e.g. 0° C.), the water-out pump 16 begins to transfer the low temperature water in the pre-cooling tank 13 to the evaporator 14, an air blown by the fan 17 passes through the evaporator 14 and then the air is cooled to be a cold air, the water that absorbed heat of the air flows out of the evaporator 14 and then flows into the pre-cooling tank 13 through the cold water pipeline 110, and the water-in pump 15 transfers the low temperature water mixed with the heat absorbed water to the cold surface module 11 for cooling.

According to a standard of the compressor of the vehicle air conditioner, the cooling requirement of the vehicle air conditioner is that the temperature of the cold air at an air outlet of the evaporator 14 under a maximum air volume of the fan 17 shall reach to 8-12° C. In the conventional vehicle air conditioner of TEC chip 1, the cooling efficiency of the cold surface module 11 is lower than a endothermic efficiency of the evaporator 14, the pre-cooling tank 13 and the cold water pipeline 110 of double circulation are hard to keep coldness, the water that absorbed the heat of the air flows back to the pre-cooling tank 13, so that the coldness of the water in the pre-cooling tank cannot be maintained. Under actual measurement at ambient temperature about 30° C., after the fan 17 operated, the temperature of the water in the pre-cooling tank 13 gradually rises from the pre-cooling temperature. When the temperature of the water in the pre-cooling tank 13 reaches a steady state (about 15° C. to 20° C.), the temperature of the cold air at the air outlet of the evaporator 14 is about 25° C. to 27° C. that cannot meet the cooling continuity requirement of vehicle air conditioners, and the large volume pre-cooling tank 13 using large amount water does not have a probability of commercial application. Therefore, how to solve the various problems of the application of the cold surface of TEC chip is a main development aspect of the present invention.

SUMMARY OF THE INVENTION

To solve the various problems of the conventional application of the cold surface of TEC chip, a device of application of the cold surface of a thermoelectric cooling (TEC) chip is provided, and the device includes a cooling part, a plate coil, a pump, a reservoir and a pipeline. The cooling part includes a box, partition plates and an auxiliary cooling structure, wherein the box has a sidewall, a first liquid inlet and a first liquid outlet, an outer surface of the sidewall is adapted to connect to a cold surface of TEC chip, the partition plates are arranged in the box and have passages, the passages of the two adjacent partition plates are located on opposite two inner surfaces of the sidewalls to form an S-turn flow channel between the partition plates, the auxiliary cooling structure has a continuous phase framework and pores. The plate coil includes a flat tube, a second liquid inlet and a second liquid outlet respectively connected to two ends of the flat tube. The pump and the reservoir are disposed between the second liquid outlet and the first liquid inlet. The pipeline communicates with the reservoir, the pump, the first liquid inlet, the first liquid outlet, the second liquid inlet and the second liquid outlet, for the pump to transfer an antifreeze to circulate through the box, the plate coil and the reservoir.

In one embodiment, the first liquid outlet and the first liquid inlet are located on an upper side and a lower side of the box along a direction of gravity.

In one embodiment, the pores accounts for 70% to 90% of volume of the auxiliary cooling structure.

In one embodiment, protruding strips are formed on the inner surface of the sidewall, and the auxiliary cooling structure is connected to the protruding strips.

In one embodiment, the second liquid inlet is located on a lower side of the plate coil along a direction of gravity.

In one embodiment, a capacity of the box to load the antifreeze is greater than a capacity of the plate coil, the pipeline and the reservoir to load the antifreeze.

In one embodiment, a volume of the reservoir is not greater than 200 milliliter.

In one embodiment, the pump and the reservoir have an inlet hole and an outlet hole respectively, the outlet hole of the reservoir is embedded in the inlet hole of the pump, the outlet hole of the pump communicates with the first liquid inlet of the box through the pipeline, the first liquid outlet of the box communicates with the second liquid inlet of the plate coil through the pipeline, the second liquid out let of the plate coil communicates with the inlet hole of the reservoir through the pipeline.

In one embodiment, the device of application of the cold surface of TEC chip further includes fins connected to the flat tube.

In one embodiment, the device of application of the cold surface of TEC chip further includes a container and a fan, wherein the container has an air inlet area and an air outlet area, the fan is disposed in the air inlet area, and the plate coil is disposed between the air inlet area and the air outlet area.

The device of application of the cold surface of TEC chip of the present invention significantly increases the heat exchange area of the box and plate coil and has excellent thermal conductivity, when the TEC chip starts to operate, the coldness of the cold surface of the TEC chip can be immediately transferred. Compared with the prior art, the device of application of the cold surface of TEC chip of the present invention does not require to use a pre-cooling tank, thereby significantly reducing the antifreeze use amount and the circulating pipeline which easily cause coldness loss, the cooling performance thereof can meet the standards of products such as vehicle air conditioners, elevator air conditioners, beauty equipment, mobile refrigerators, vaccine storage boxes, and organ storage boxes, so that the device of the present invention has extremely high industrial availability.

DETAILED DESCRIPTION OF THE PREFERRED EMBODIMENT

The embodiments of the present invention are described below in more detail with accompanying drawings and component symbols, so that a person having ordinary skill in the art may implement the present disclosure after studying the present specification. The terms used herein are intended to describe a particular embodiment only and are not intended to limit the present invention. Unless the context clearly indicates otherwise, the terms used herein contain both singular and plural forms. The term "and/or" includes any and all combinations of one or more of the relevant components. When one element is "connected" or "communicated" to another element, includes a status that two elements are directly connected or a status that there is an intermediate element connected the two elements and a fluid can pass through the two elements.

Figure 1:
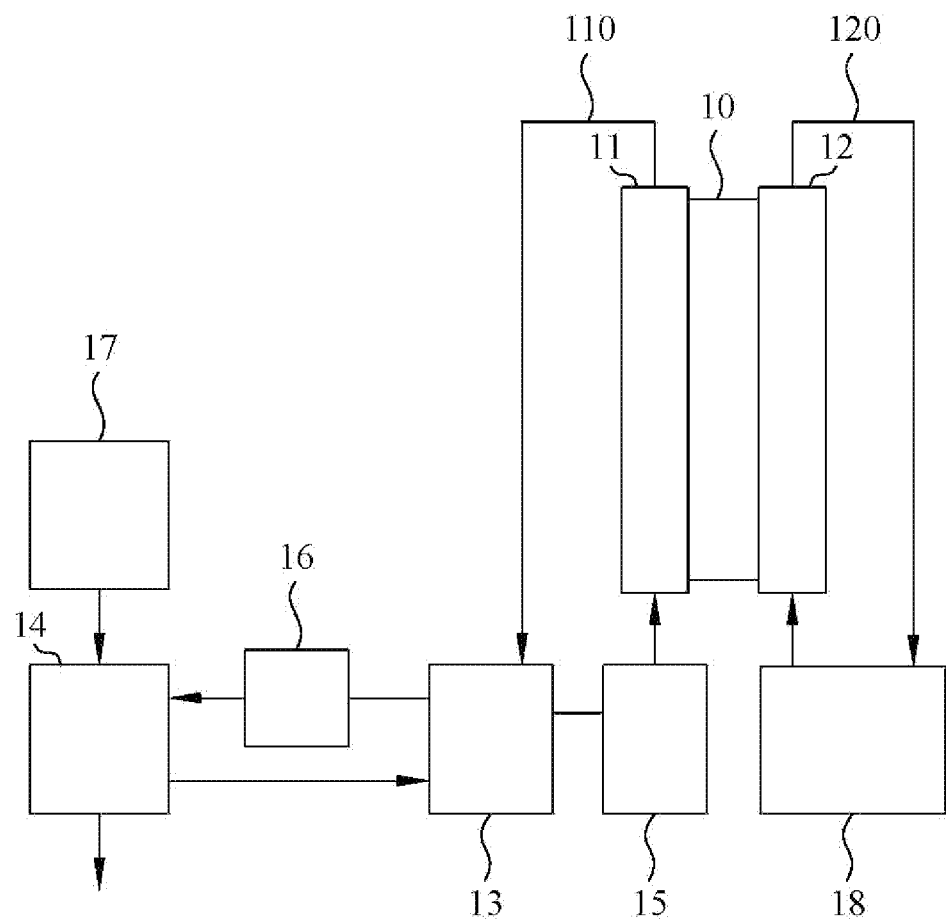
FIG. 1 is a block diagram illustrating a conventional vehicle air conditioner of TEC chip.
Figure 2:
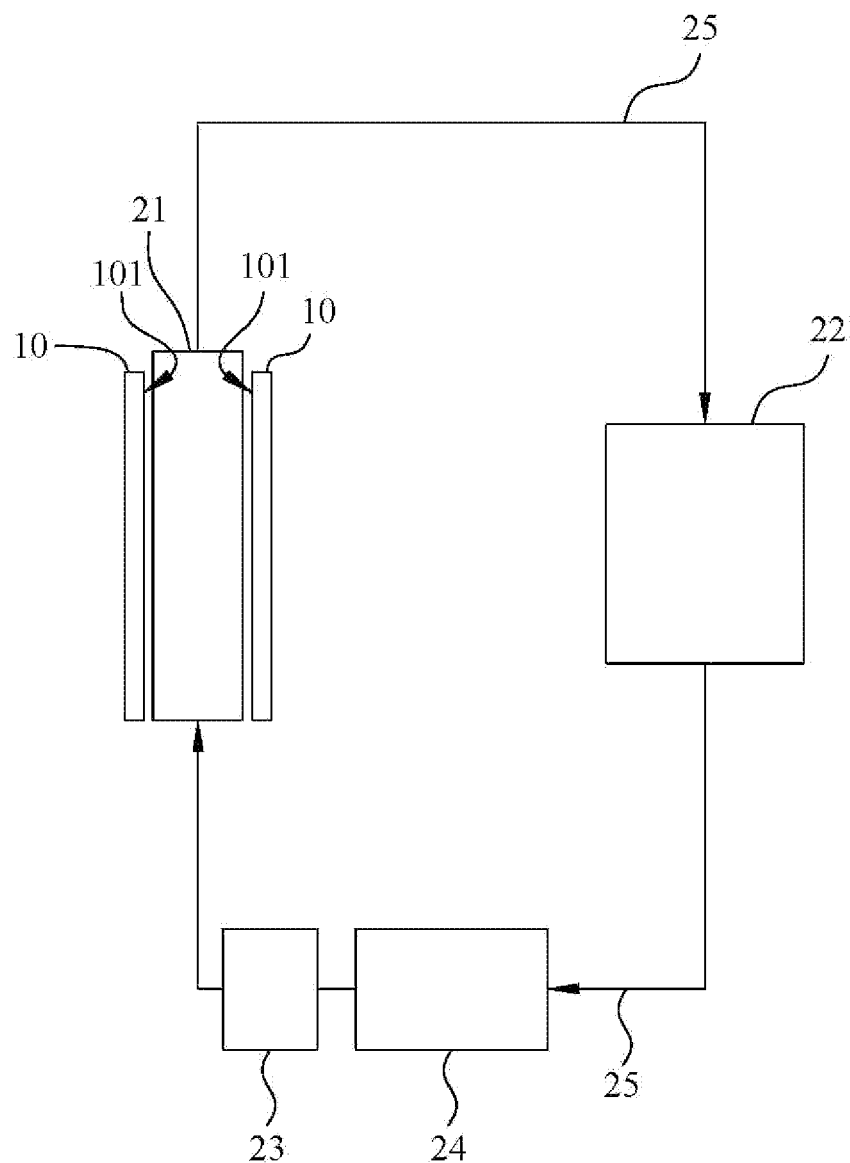
FIG. 2 is a block diagram illustrating a device of application of the cold surface of TEC chip according to an embodiment of the present invention.

FIG. 2 is a block diagram illustrating a device of application of the cold surface of TEC chip according to an embodiment of the present invention. As shown in FIG. 2, a device of application of the cold surface of TEC chip 2 includes a cooling part 21, a plate coil 22, a pump 23, a reservoir 24 and a pipeline 25, wherein the cooling part 21 is connected to cold surfaces 101 of TEC chips 10, the pump 23 and the reservoir 24 are disposed between the cooling part 21 and the plate coil 22, the pipeline 25 communicates with the cooling part 21, the plate coil 22, the reservoir 24 and the pump 23. When the TEC chips 10 and the device of application of the cold surface of TEC chip 2 start to operate, the pump 23 circulates an antifreeze (e.g. ethanol aqueous solution with an ethanol concentration more than 50%) through the cooling part 21, the plate coil 22 and the reservoir 23 (a flow direction shown by arrow in FIG. 2) via the pipeline 24 for heat exchange, thereby conducting a coldness of the cold surfaces 101 of the TEC chips 10.

Figure 3A:
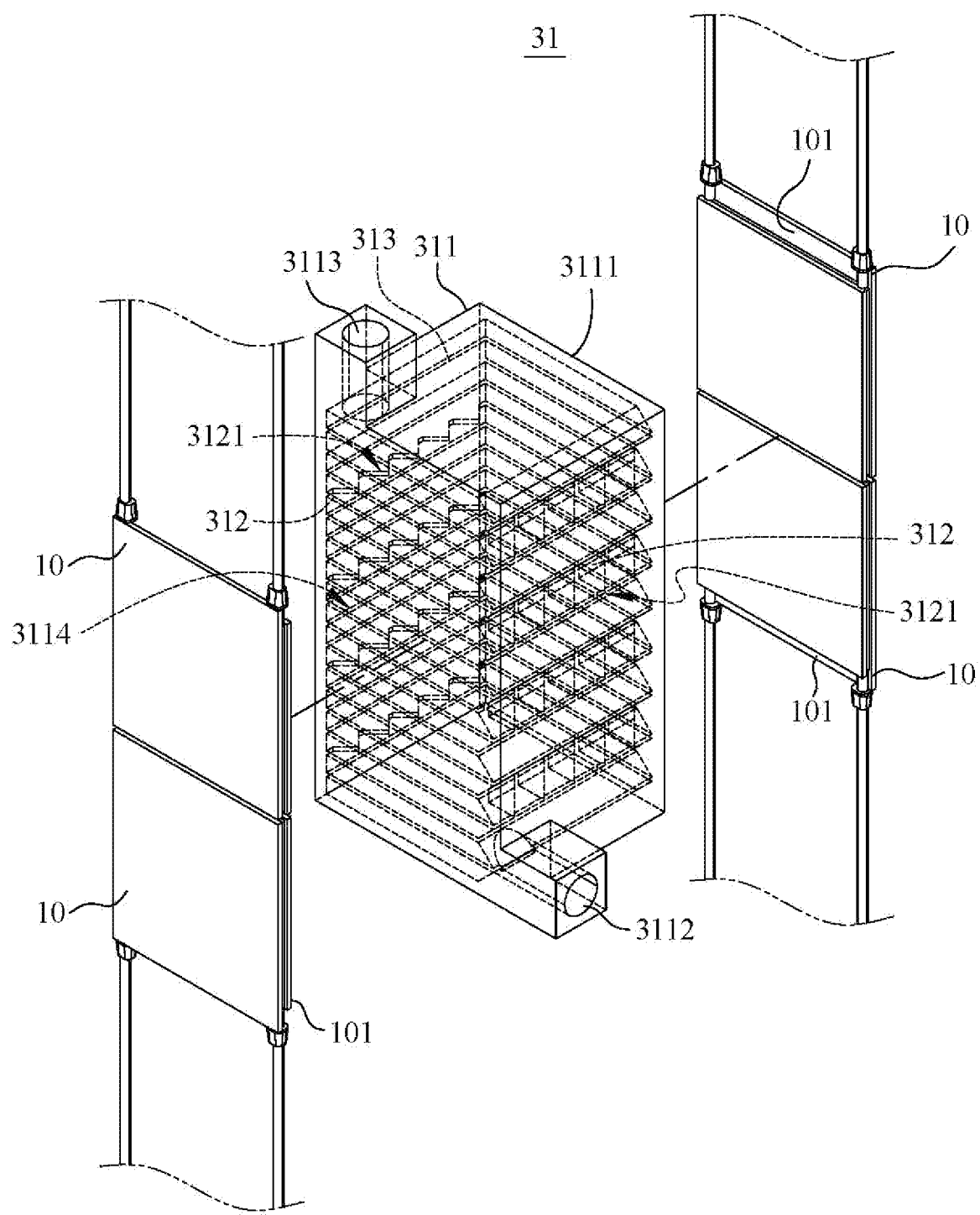
FIG. 3A is a perspective view illustrating a cooling part of a device of application of the cold surface of TEC chip according to an embodiment of the present invention.

FIG. 3A is a perspective view illustrating a cooling part of the device of application of the cold surface of TEC chip according to an embodiment of the present invention. As shown in FIG. 3A, in this embodiment, a cooling part 31 of the device of application of the cold surface of TEC chip includes a box 311, a plurality of partition plates 312 and an auxiliary cooling structure 313, wherein the box 311 has a sidewall 3111, a first liquid inlet 3112 and a first liquid outlet 3113, wherein an outer surface of the sidewall 3111 is adapted to connect to the cold surfaces 101 of the TEC chips 10, the partition plates 312 are arranged in the box 311 and have passages 3121, and the passages 3121 of two adjacent partition plates 312 are located on two opposite inner surfaces of the sidewalls 3111 to form an S-turn flow channel 3114 between the partition plates 312, the auxiliary cooling structure 313 is disposed in the S-turn flow channel 3114, and has a continuous phase framework and pores.

The box 311 can be made of a metal material with high thermal conductivity (such as but not limited to aluminum, copper, aluminum alloy). The box 311 has four rectangular sidewalls 3111, the first liquid inlet 3112 and the first liquid outlet 3113 protrude from upper and lower sides of the sidewalls 311. A amount of the sidewalls 3111 of the box 311 connected to the cold surfaces 101 of the TEC chips 10 can be single or plural, an outer surface size of the sidewall 3111 connected to the cold surfaces 101 can be designed according to the number and size of the TEC chips 10, an area of its outer surface is greater than an area of one or total area of more (such as but not limited to two, three, four) cold surface(s) 101, and the remaining area of the sidewalls exceeds the cold surfaces 101 is equal to thicknesses of the two sidewalls 3111 which are not connected to the cold surfaces 101, thereby reducing the low temperature of the cold surfaces 101 to be conducted to the two sidewalls 3111 which are not connected to the cold surfaces 101. In this embodiment, the two opposite sidewalls 3111 of the box 311 are respectively connected to the cold surfaces 101 of the two TEC chips 10 arranged up and down, a distance between the two sidewalls 3111 connected to the cold surfaces 101 (i.e. a width of the sidewalls 3111 not connected to the cold surfaces 101) is not greater than a length of the cold surfaces 101, so that a temperature difference between an inner surface of the sidewall 3111 and the antifreeze in middle region of the box 311 can be avoided.

The partition plates 312 can be made of the metal material with high thermal conductivity (such as but not limited to aluminum, copper, aluminum alloy, etc). A amount of the partition plates 312 can be adjusted according to the amount and area of the TEC chips 10 connected to the box 311; for example but not limited to, each of the TEC chips 10 corresponds to four partition plates 312 (i.e. the amount of the partition plates 312 is four times of the amount of the TEC chips 10, and the amount of the layer of the S-turn flow channel 3114 is the amount of the partition plates 312 plus one). Each of the partition plates 312 contacts with the opposite two inner surfaces of the sidewalls 3111 connected to the cold surfaces 101, the passages 3121 of the two adjacent partition plates 312 are respectively towards the opposite two inner surfaces of the sidewalls 3111 not connected to the cold surfaces 101, so that the S-turn flow channel 3114 is turned at the opposite two inner surfaces of the sidewalls 3111 not connected to the cold surfaces 101.

The auxiliary cooling structure 313 can be made of the metal material with high thermal conductivity (e.g. nickel, aluminum, aluminum alloy, nickel alloy, etc) to be a block structure having the continuous framework and the pores; for example but not limited to, one or plural metal foams, one or plural metal meshes and/or one or plural metal sponges, wherein the plural metal meshes are horizontally or vertically arranged, and the metal sponge is formed by intertwining a plurality of metal strips. The auxiliary cooling structure 313 contacts with the inner surfaces of the sidewalls 3111 and the partition plates 312, the continuous phase framework having a large thermal conduction area and a high thermal conductivity can rapidly conduct the coldness of the cold surface 101 (i.e. conduct the heat of the antifreeze), and the pores may allow the antifreeze pass through the S-turn flow channel 3114. A thickness of the auxiliary cooling structure 313 is between 10 mm and 200 mm, the pores accounts for 70% to 90% of volume of the auxiliary cooling structure 313, and pore sizes of the pores is between 0.5 mm to 3.0 mm.

When the TEC chips 10 is powered on and operating, the cold surfaces 101 generates low temperature, the uncooled or room temperature antifreeze from the first liquid inlet 3112 located on lower side of the box 311 passes through the S-turn flow channel 3114 along the opposite direction of gravity, and it rapidly exchanges heat with the cold surfaces 101 (the antifreeze dissipates heat or absorbs the coldness) by the auxiliary cooling structure 313, the partition plates 312 and the sidewalls 3111, and the cooled antifreeze flows out of the box 311 from the first liquid outlet 3113.

It is noted that a thermal conductivity of air is much lower than those of liquids and solids, if there are air or air bubbles in the S-turn flow channel 3114 or the antifreeze, the heat exchange rate will be significantly affected. In the present invention, the antifreeze is designed to pass through the S-turn flow channel 3114 from bottom to top, such design can effectively remove the air in the antifreeze and the S-turn flow channel 3114, thereby ensuring that the temperature of the antifreeze can be rapidly and sufficiently reduced to the target temperature. On a direction perpendicular to the flowing of the antifreeze, the cross-sectional areas of the first liquid inlet 3112 and the first liquid outlet 3113 are the same, a cross-sectional area of each the passage 3121 for turning the flow direction of the antifreeze is about 1.1 to 1.2 times of the cross-sectional area of the first liquid inlet 3112 or the first liquid outlet 3113, which can slightly slow down the turning flow velocity of the antifreeze; accordingly, the heat exchange efficiency is further improved by changing the flow velocity of the antifreeze in the S-turn flow channel 3114 multiple times. A thermal pad or thermal paste having high thermal conductivity can be sandwiched between the sidewall 3113 of the box 311 and the cold surfaces 101 of the TEC chips 10, thereby further increasing the heat exchange efficiency between the box 311 and the cold surfaces 101.

Figure 3B:
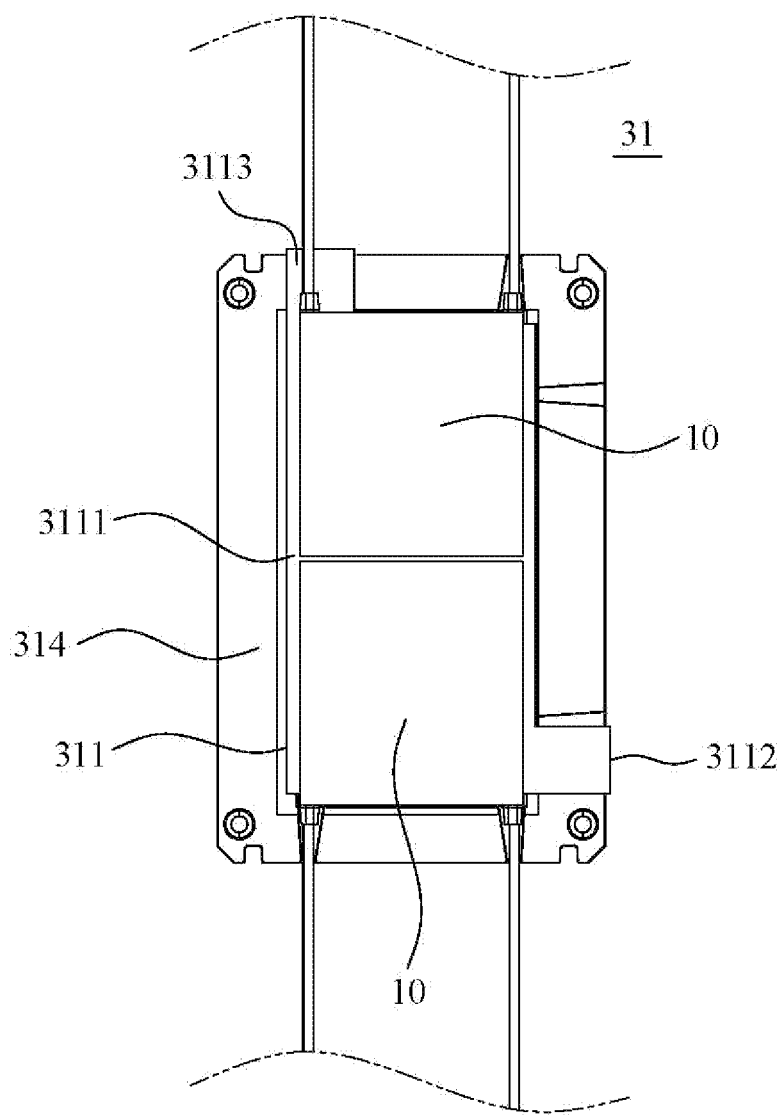
FIG. 3B is a side view illustrating the cooling part of the device of application of the cold surface of TEC chip according to another embodiment of the present invention.

FIG. 3B is a side view illustrating the cooling part of the device of application of the cold surface of TEC chip according to another embodiment of the present invention. As shown in FIG. 3B, the cooling part 31 of the device of application of the cold surface of TEC chip includes the box 311, the partition plates 312 and the auxiliary cooling structure 313 described in the aforesaid embodiment, and further includes a thermal insulation structure 314, wherein the box 311 is disposed in the thermal insulation structure 314. In this embodiment, the thermal insulation structure 314 is a frame with two-sided horizontal openings, and upper and lower parts of the insulating structure 314 are formed with grooves which may allow the first liquid outlet 3113 and the first liquid inlet 3112 be embedded therein. In the four sidewalls 3111 of the box 311, the positions of the two sidewalls 3111 connected to TEC chips are aligned with the positions of the openings of the insulating structure 314, the two sidewalls 3111 not connected to TEC chips are covered by the thermal insulation structure 314. Thermal insulation structure 314 can be made of a material with low thermal conductivity (such as but not limited to polystyrene, plastic steel, polymer thermal insulation materials, etc), the internal space of the thermal insulation structure 314 is slightly larger than the external volume of the box 311, the space between the thermal insulation structure 314 and the box 311 may be filled with an thermal insulation material, thereby preventing the air from contacting the low temperature box 311 and producing condensed water, which could cause coldness loss of the antifreeze and damage to other appliances.

Figure 4:
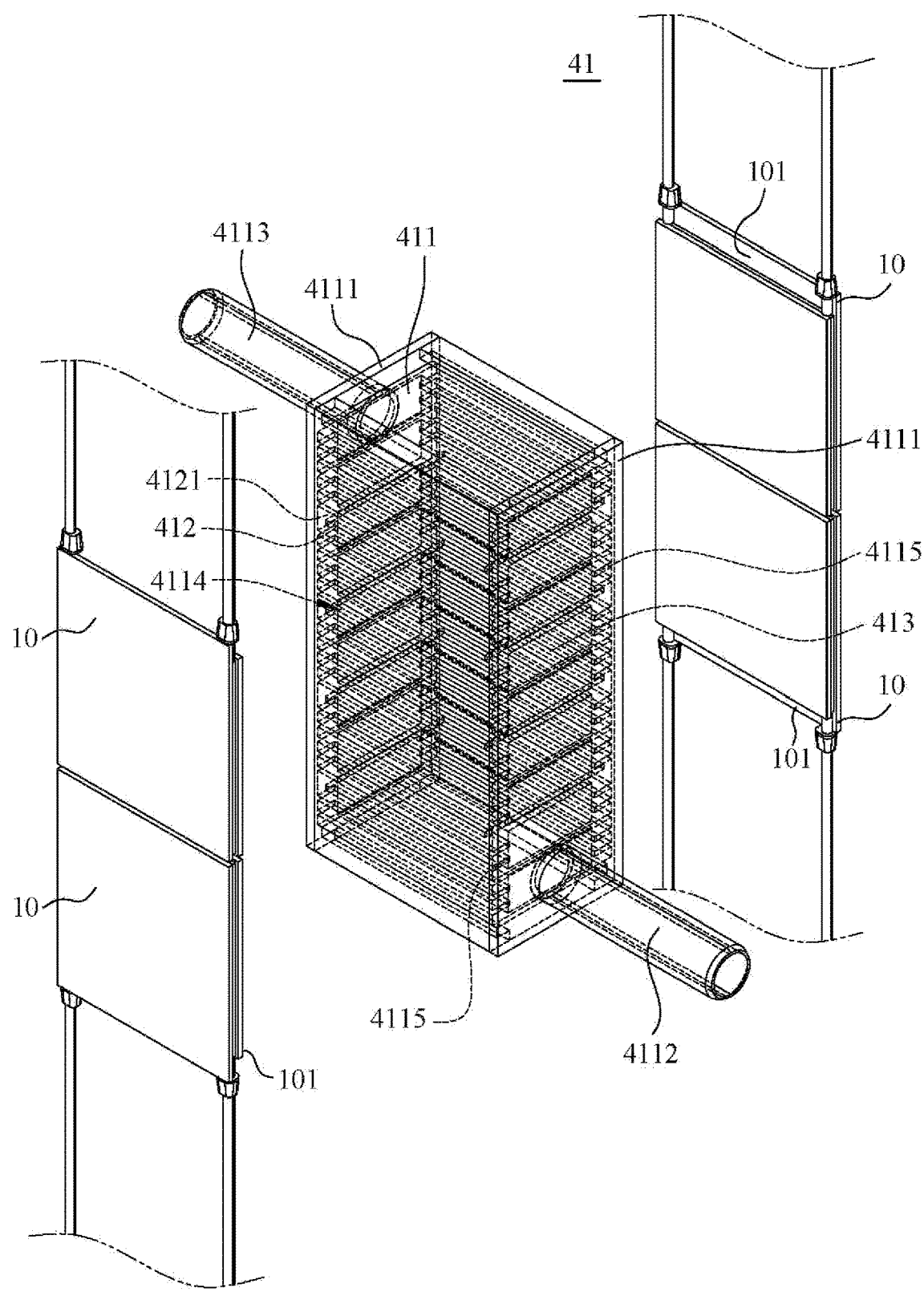
FIG. 4 is a perspective view illustrating a cooling part of a device of application of the cold surface of TEC chip according to another embodiment of the present invention.

FIG. 4 is a perspective view illustrating a cooling part of a device of application of the cold surface of TEC chip according to an embodiment of the present invention. As shown in FIG. 4, in this embodiment, a cooling part 41 of the device of application of the cold surface of TEC chip includes a box 411, a plurality of partition plates 412 and an auxiliary cooling structure 413, the box 411 has sidewalls 4111, a first liquid inlet 4112, a first liquid outlet 4113 and a plurality of protruding strips 4115, wherein the protruding strips 4115 are formed on the opposite two inner surfaces of the sidewalls 4111 connected to the cold surfaces 101 of the TEC chips 10; the partition plates 412 are arranged in the box 411 and have passages 4121, and the passages 4121 of two adjacent partition plates 412 are located on the two opposite inner surfaces of the sidewalls 4111 not connected cold surfaces 101 of the TEC chips 10 to form an S-turn flow channel 4114 between the partition plates 412; the auxiliary cooling structure 413 has a continuous phase framework and pores, and is disposed in the S-turn flow channel 4114 and connected to the protruding strips 4115.

The box 411 and the partition plates 412 can be made of the metal material with high thermal conductivity (such as but not limited to aluminum, copper, aluminum alloy, etc), and the auxiliary cooling structure 413 can be made of the metal material with high thermal conductivity (such as but not limited to nickel, aluminum, nickel alloy, aluminum alloy), the auxiliary cooling structure 413 contacts the protruding strips 4115 and the partition plates 412, the low temperature of the cold surfaces 101 of the TEC chips 10 can be quickly conducted to the sidewall 4111, the protruding strips 4115, the partition plates 412 and the auxiliary cooling structure 413, so that the low temperature of the sidewall 4111 is conducted to the auxiliary cooling structure 413 through the protruding strips 4115, the continuous framework and the pores of the auxiliary cooling structure 413 can disperse the antifreeze, thereby significantly increasing the heat exchange area and efficiency of the antifreeze in the box 411.

Figure 5A:
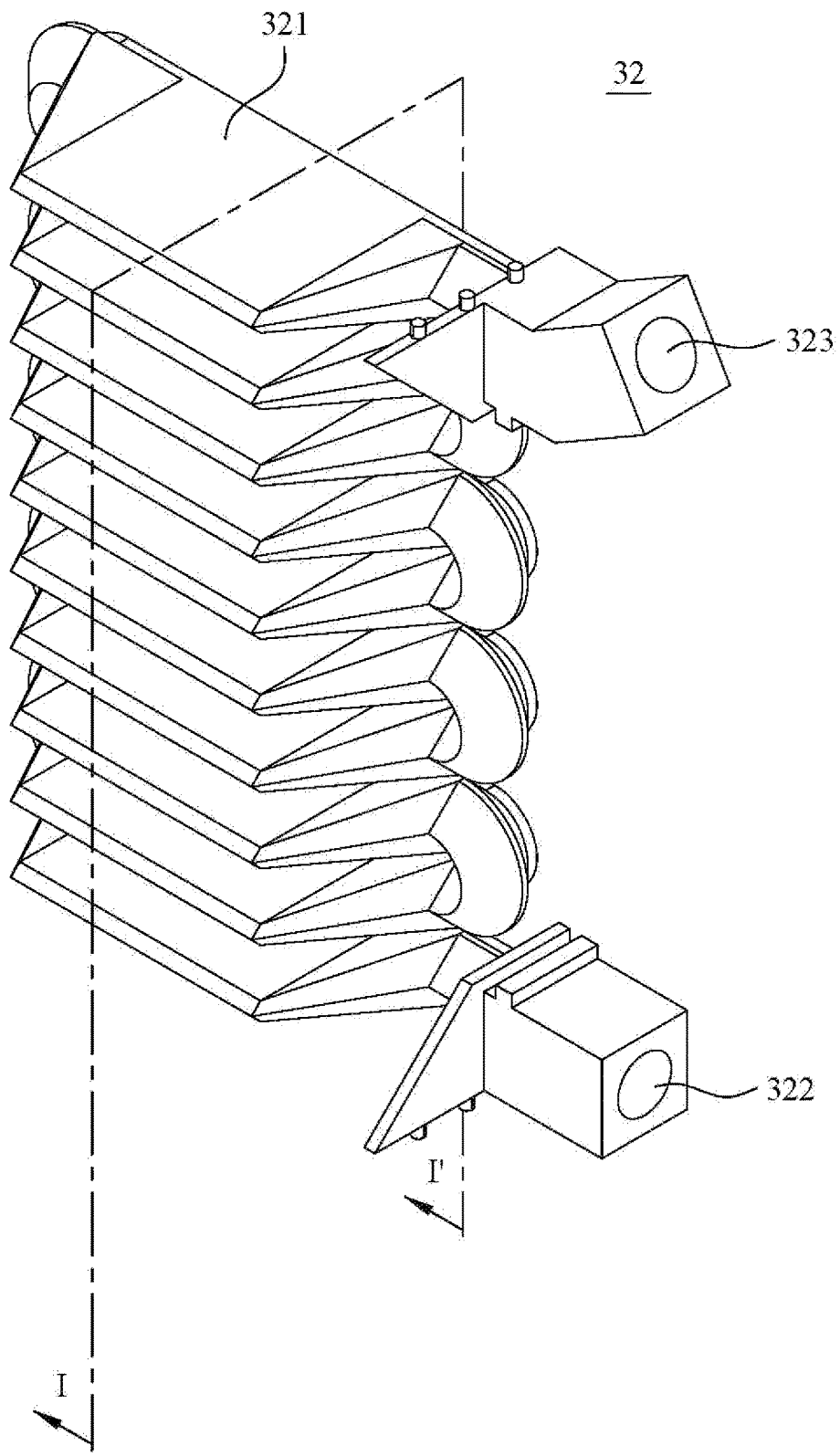
FIG. 5A is a side view illustrating a plate coil of a device of application of the cold surface of TEC chip according to an embodiment of the present invention.
Figure 5B:
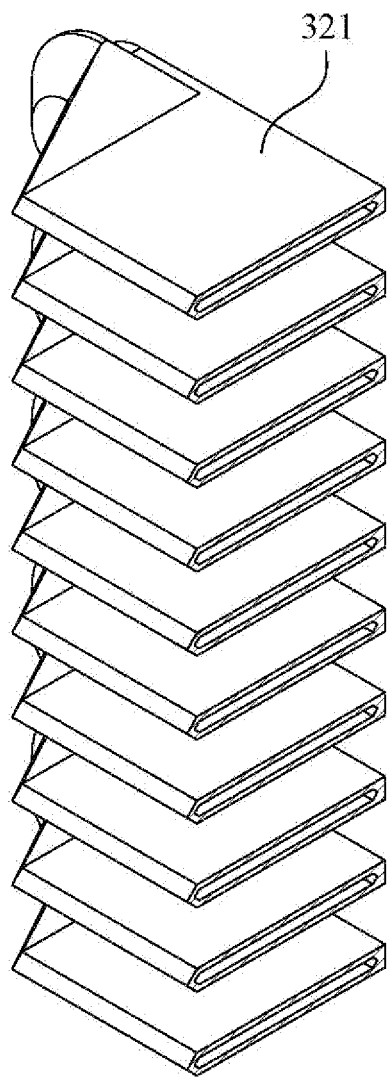
FIG. 5B is a sectional view illustrating the section part II' in FIG. 5A.

FIG. 5A is a side view illustrating a plate coil of a device of application of the cold surface of TEC chip according to an embodiment of the present invention, and FIG. 5B is a sectional view illustrating the section part II' in FIG. 5A. As shown in FIG. 5A, a plate coil 32 of a device of application of the cold surface of TEC chip includes a flat tube 321, a second liquid inlet 322 and a second liquid outlet 323 respectively connected to two ends of the flat tube 321. The arrangement direction (horizontal, inclined or vertical) of the second liquid inlet 322 and the second liquid outlet 323 may be adjusted according to installation requirements, if it is considered to prevent or eliminate the air bubbles in the plate coil 32 or the antifreeze, the second liquid inlet 322 may be located on a lower side of the plate coil 32 along a direction of gravity.

In this embodiment, the plate coil 32 can be made of a metal material with high thermal conductivity (such as but not limited to aluminum, copper, aluminum alloy), on the direction perpendicular to the flowing of the antifreeze, cross-sectional areas of the flat tube 321, the second liquid inlet 322 and the second liquid outlet 323 are the same, the cross-sections of the second liquid inlet 322 and the second liquid outlet 323 are circular; as shown in FIG. 5B, the cross-sectional area of the flat tube 321 is oblate elliptical (The ratio of the long axis and short axis of the cross-section is between 25 and 50), an interval between the opposite two tube walls of the flat tube 321 is small, the antifreeze has no temperature gradient between the opposite two tube walls, the flat tube walls of the flat tube 321 facilitate the connection of a heat conductor (e.g., heat dissipation fins) or a heat emitter (e.g., computer chips) for heat exchange with the antifreeze.

Figure 6A:
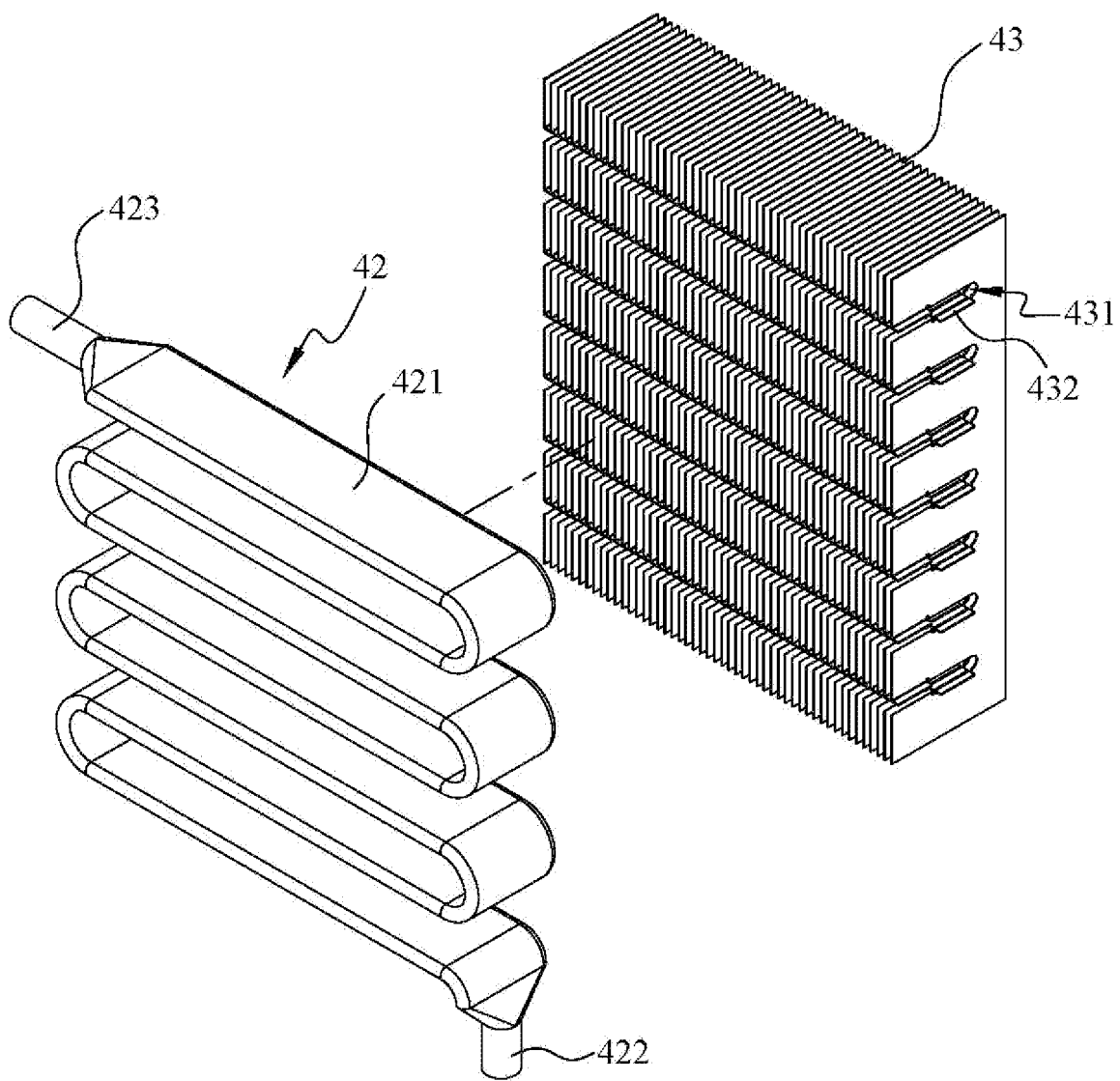
FIG. 6A is a side view illustrating a plate coil and fins of a device of application of the cold surface of TEC chip according to an embodiment of the present invention.

FIG. 6A is a side view illustrating a plate coil and fins of a device of application of the cold surface of TEC chip according to an embodiment of the present invention. As shown in FIG. 6A, a device of application of the cold surface of TEC chip includes a plate coil 42 and fins 43, wherein the plate coil 42 includes a flat tube 421, a second liquid inlet 422 and a second liquid outlet 423 respectively connected to two ends of the flat tube 421, the fins 43 are connected to the flat tube 421. In this embodiment, the plate coil 42 can be made of a circular metal tube with high thermal conductivity (such as but not limited to copper, aluminum, etc), the plate coil 42 can be formed by remaining the two ends of the circular metal tube to form the second liquid inlet 422 and the second liquid outlet 423, gradually hammering the circular metal tube into the flat tube 421 between the second liquid inlet 422 and the second liquid outlet 423, and then bending the flat tube 421 in form of U-shape according to the needs of the heat exchange area, the second liquid outlet 423 and the second liquid inlet 422 are located on an upper side and a lower side of the plate coil 42 along the direction of gravity. The fins 43 can be made of the metal material with high thermal conductivity (such as but not limited to copper, aluminum, etc), grooves 431 and connecting sheets 432 are formed on the fins corresponding to the shape of the flat tube 421 of the plate coil 42, the flat tube 421 of the plate coil 42 is embedded in the grooves 431 of the fins 43 and welded to the connecting sheets 432, A fan can be disposed on or electronic components (e.g., central processing unit, graphics processing unit, etc.) can be bonded to a side of the fins 43 opposite to the plate coil 42, thereby significantly increasing the heat exchange area between the low temperature antifreeze and the air flow or heat emitter.

Figure 6B:
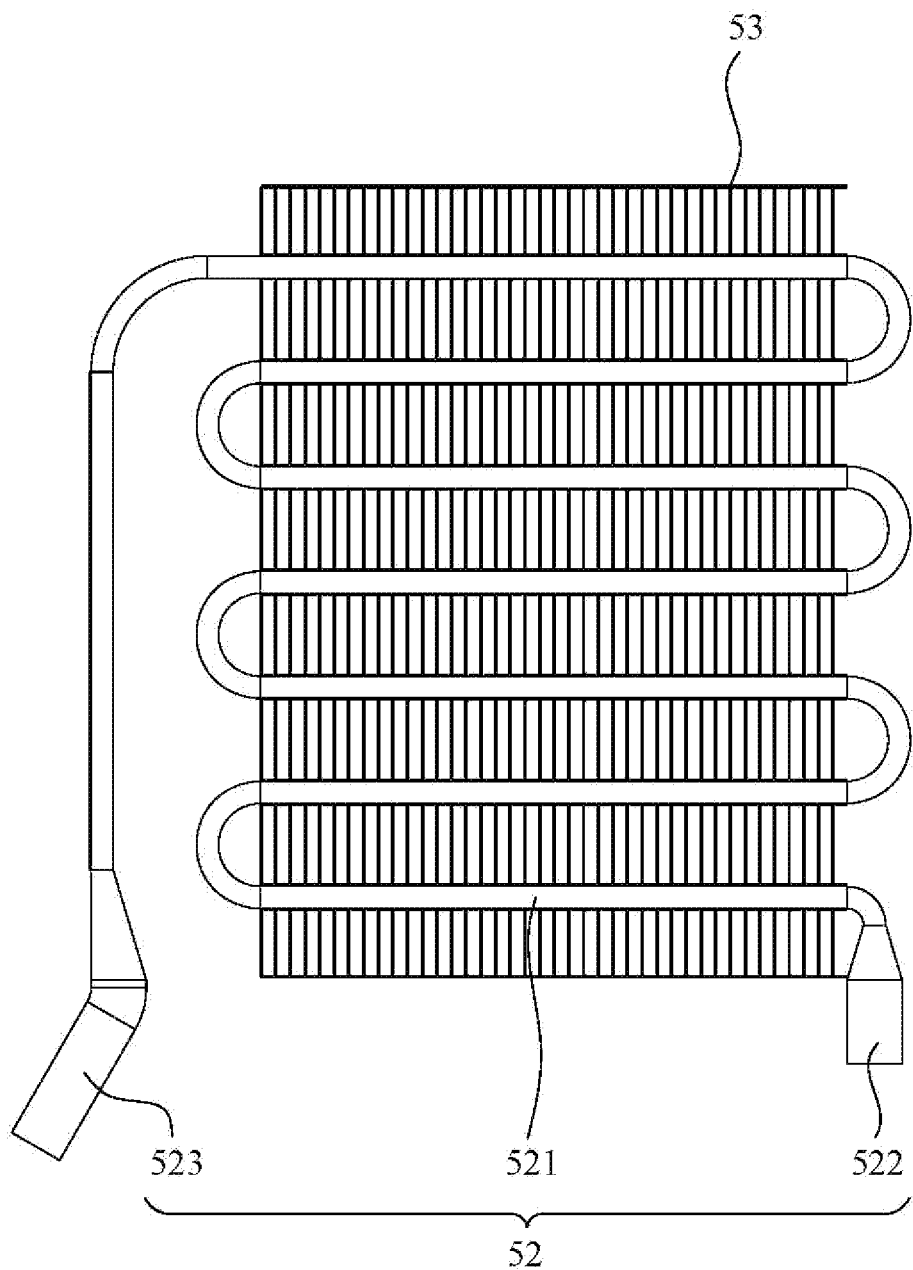
FIG. 6B is a front view illustrating a plate coil and fins of a device of application of the cold surface of TEC chip according to another embodiment of the present invention.

FIG. 6B is a front view illustrating a plate coil and fins of a device of application of the cold surface of TEC chip according to another embodiment of the present invention. As shown in FIG. 6B, a device of application of the cold surface of TEC chip includes a plate coil 52 and fins 53, wherein the plate coil 52 includes a flat tube 521, a second liquid inlet 522 and a second liquid outlet 523 respectively connected to two ends of the flat tube 521, the flat tube 521 is embedded and welded in the fins 53. In this embodiment, the plate coil 52 and the fins 53 can be made of a circular metal tube with high thermal conductivity (such as but not limited to copper, aluminum, etc), the plate coil 52 can be formed by remaining the two ends of the circular metal tube to form the second liquid inlet 522 and the second liquid outlet 523, gradually hammering the circular metal tube into the flat tube 521 between the second inlet 522 and the second outlet 523, and then bending the flat tube 521 in form of U-shape according to the needs of the heat exchange area, the second liquid outlet 523 and the second liquid inlet 522 are located on a lower side of the plate coil 52 along the direction of gravity, thereby facilitating the connection of the pipeline configuration of the cooling part.

Figure 7:
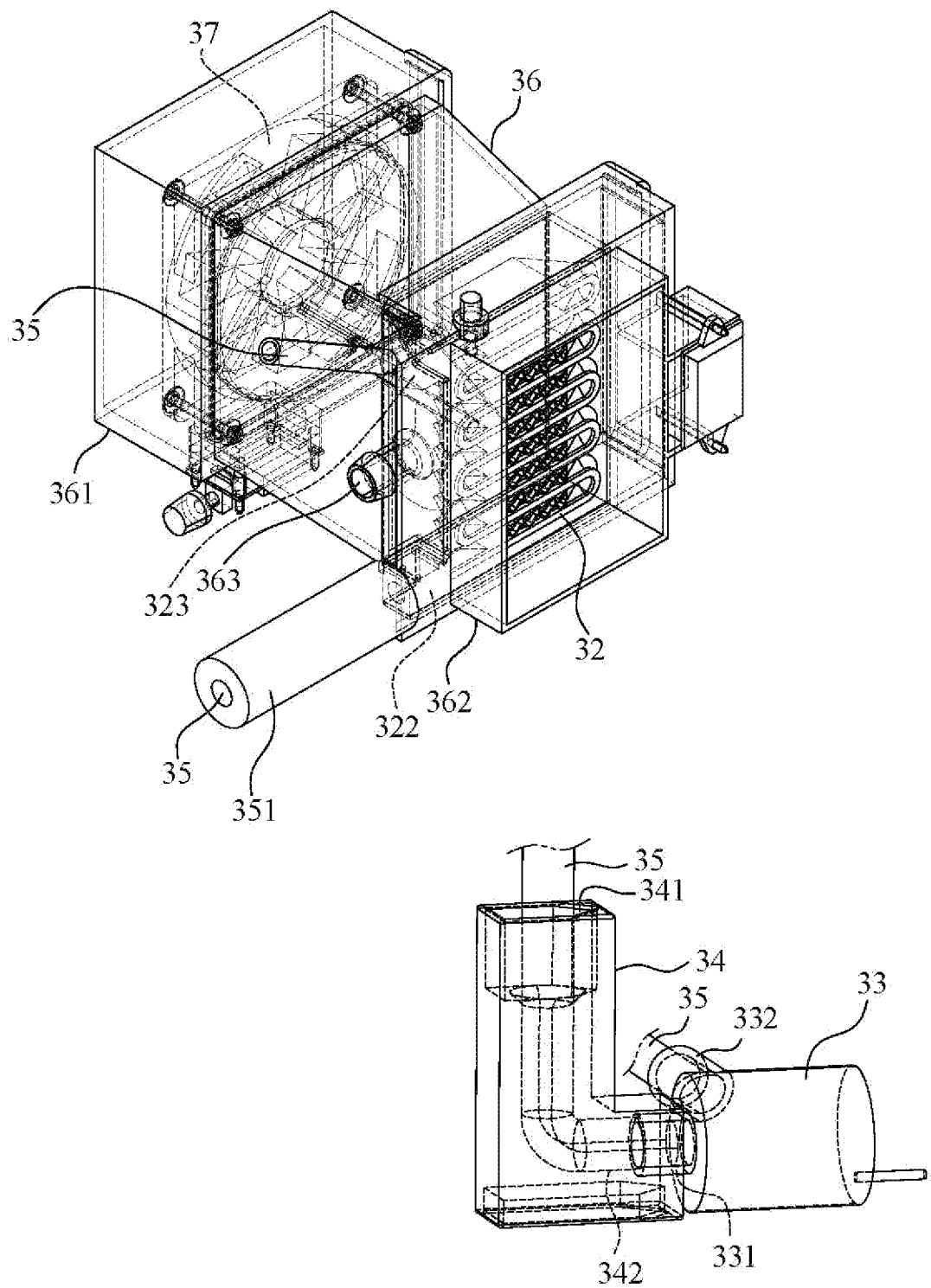
FIG. 7 is a transparent perspective view illustrating a device of application of the cold surface of TEC chip according to an embodiment of the present invention.

FIG. 7 is a transparent perspective view illustrating a device of application of the cold surface of TEC chip according to an embodiment of the present invention. As shown in FIGS. 3A, 3B and 7, a device of application of the cold surface of TEC chip 3 includes the cooling part 31, the plate coil 32, a pump 33, a reservoir 34 and a pipeline 35; and further includes a container 36 and a fan 37, wherein the container 36 has an air inlet area 361, an air outlet area 362 and a discharge joint 363, the fan 37 is disposed in the air inlet area 361, the plate coil 32 is disposed between the air inlet area 361 and the air outlet area 362, the discharge joint 363 is located below the plate coil 32. The pump 33 and the reservoir 34 have an inlet hole 331, 341 and an outlet hole 332, 342 respectively, the outlet hole 342 of the reservoir 34 is embedded in the inlet hole 331 of the pump 33, the outlet hole 332 of the pump 33 communicates with the first liquid inlet 3112 of the box 311 through the pipeline 35, the first liquid outlet 3113 of the box 311 communicates with the second liquid inlet 322 of the plate coil 32 through the pipeline 35 wrapped with the thermal insulation material 351, the second liquid outlet 323 of the plate coil 32 is connected to the inlet hole 341 of the reservoir 34 through the pipeline 35, thereby forming a closed flow channel of the antifreeze.

In this embodiment, the box 36 can be made of engineering plastics (ABS, PC, PC add ABS), the pipeline 35 connected to the first liquid outlet 3113 of the box 311 and the second liquid inlet 322 of the plate coil 32 is wrapped with the thermal insulation material 351 to prevent coldness loss of the low temperature antifreeze; a submerged pump can be chosen as the pump 33, the outlet hole 342 of the reservoir 34 is embedded in the inlet hole 331 of the pump 33, the pipeline between the pump 33 and the reservoir 34 is omitted, thereby preventing the antifreeze from absorbing the heat of the environment and being heated; an axial flow fan can be chosen as the fans 37, the low temperature antifreeze flows into the plate coil 32, an airflow introduced by the fan 37 is cooled by the low temperature conducted by the plate coil 32, the low temperature airflow through the air outlet area 362 may be used to reduce the temperature of the environment or heat emitter; the water vapor contained in the airflow introduced by the fans 37 will condense into water when it contacts with the low temperature plate coil 32, the condensed water can flow out of the container 36 through the discharge joint 363; the antifreeze flows into reservoir 34 through the pipeline 35 after heat absorption, the pump 33 transfers the antifreeze in the reservoir 34 to the box 311 of the cooling part 31. In other embodiment, a blower fan or cross flow fan can be chosen as the fan, an extraction pump can be chosen as the pump, the outlet hole of the reservoir is connected to the inlet hole of the pump through the pipeline, the position of the reservoir can be flexibly adjusted and the capacity of the reservoir can be reduced.

It is noted that the antifreeze is circulated in a closed flow channel, when the device of application of the cold surface of TEC chip operates; the total volume of the antifreeze required is not more than 500 ml, the antifreeze volume loaded in the S-turn flow channel 3114 of the box 311 is greater than the antifreeze volume loaded outside (including plate coil 32, pipeline 35 and reservoir 34) of the S-turn flow channel 3114 (its ratio is between 1 and 2, e.g. 1.2, 1.4, 1.5), and the heat exchange efficiency of the cooling part 31 for the antifreeze is not lower than the heat exchange efficiency of the plate coil 32 for the antifreeze, thus the cooling part 31 still can continuously provide enough low-temperature antifreeze to the plate coil 32 to absorb the heat from the air without a pre-cooling tank set therein, and allow the airflow of the air outlet area 362 remaining low temperature. When the device of application of the cold surface of TEC chip 3 is activated, the closed flow channel where the antifreeze circulates needs to discharge air, to avoid the air bubbles affecting the heat exchange and flow rate of the antifreeze; when the device starts operation, the reservoir 34 can be used to discharge the air within the box 311 and the plate coil 32; after long time operation, there may be partial loss of the antifreeze, the user can add the antifreeze through the reservoir 34; when the pump 33 accelerates the circulation of the antifreeze, the antifreeze stored in the reservoir 34 can supply an additional amount of the antifreeze needed to accelerate the circulation. The volume of the reservoir 34 is not greater than 200 ml (e.g., but not limited to 150, 120 ml).

The performance of the device of application of the cold surface of TEC chip 3 was measured with four TEC chips, the ambient temperature is set at 30° C. or above, an initial temperature of the antifreeze is between 25 and 30° C., the pump 33 is turned on to circulate the antifreeze, then the TEC chips 10 is turned on; after the TEC chips 10 are activated, the temperature of the antifreeze in the box 311 of the cooling part 31 and the plate coil 32 is reduced to 0° C. within 1 to 1.5 minutes, to −10° C. within 3-3.5 cumulative minutes, and to −20° C. within 5 to 5.5 cumulative minutes; the fan 37 is turned on and the maximum airflow of the fan 37 is set as 5-6 CFM (Cubic Feet per Minute), the surface temperature of the plate coil 32 gradually rises from −20° C. to −1~3° C. within about 5 minutes, meanwhile the air outlet area 362 produces about 8 to 12° C. cold air; the device of application of the cold surface of TEC chip 3 continues to operate for more than 1 hour, and the cold wind of the air outlet area 362 is maintained at 8 to 12° C. From the actual measuring results, it is clear that the cooling performance of the device of application of the cold surface of TEC chip 3 can meet the standards of products such as vehicle air conditioners, elevator air conditioners, beauty equipment, mobile refrigerators, vaccine storage boxes, and organ storage boxes.

Figure 8:
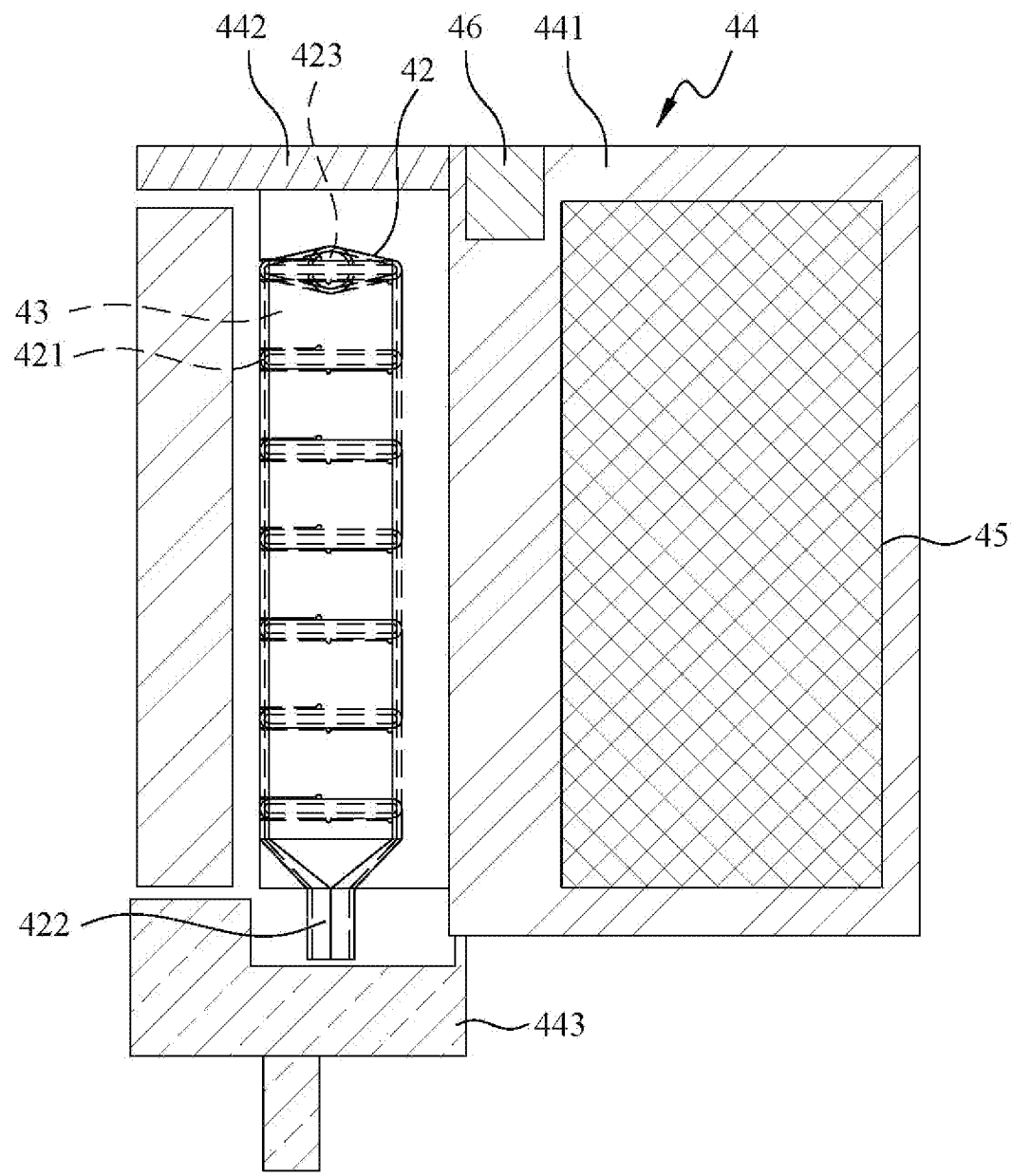
FIG. 8 is a side view illustrating a device of application of the cold surface of TEC chip according to another embodiment of the present invention.

FIG. 8 is a side view illustrating a device of application of the cold surface of TEC chip according to another embodiment of the present invention. As shown in FIGS. 4, 6A and 8, a device of application of the cold surface of TEC chip 4 includes the cooling part 41, the plate coil 42, the fins 43, the pump (not shown), the reservoir (not shown), the pipeline (not shown), and further includes a container 44, a fan 45 and a negative ion generator 46, wherein the container 44 has an air inlet area 441, an air outlet area 442 and a water-out area 443, the fan 45 is disposed in the air inlet area 441, the plate coil 42 is disposed between the air inlet area 441 and the air outlet area 442 and located above the water-out area 443, the fins 43 are connected to the plate coil 42, the negative ion generator 46 is disposed between the fan 45 and the plate coil 42.

In this embodiment, the box 44 can be made of engineering plastics (ABS, PC, PC add ABS), areas of the air inlet area 441, the fins 43 and the air outlet area 442 are substantially the same; the blower fan is chosen as the fan 45, the negative ion generator 46 can produce negative ions or ozone to remove dust, PM2.5, and viruses from the air, the airflow introduced by the fan 45 is quickly cooled by the low temperature fins 43 and plate coil 42, the airflow with the negative ion through the air outlet area 442 may be used to reduce the temperature of the environment or heat emitter, condensed water generated by that the air introduced by the fan 45 contacts with the low temperature plate coil 42 discharge from the container 44 after flowing into the water-out area 443, the antifreeze flows back to the box 411 of the cooling part 41 through the pipeline after heat absorption.

The performance of the device of application of the cold surface of TEC chip 4 was measured by four TEC chips, the ambient temperature is set at 30° C. or above, the initial temperature of the antifreeze is between 25 and 30° C., the pump is turned on to circulate the antifreeze, then the TEC chips and the fan 45 are turned on, the maximum airflow of the fan 45 is set as 5-6 CFM (Cubic Feet per Minute), the surface temperature of the plate coil 42 is reduced to −1~3° C. within about 5 minutes, meanwhile the air outlet area 442 produces about 8 to 12° C. cold air.

Figure 9:
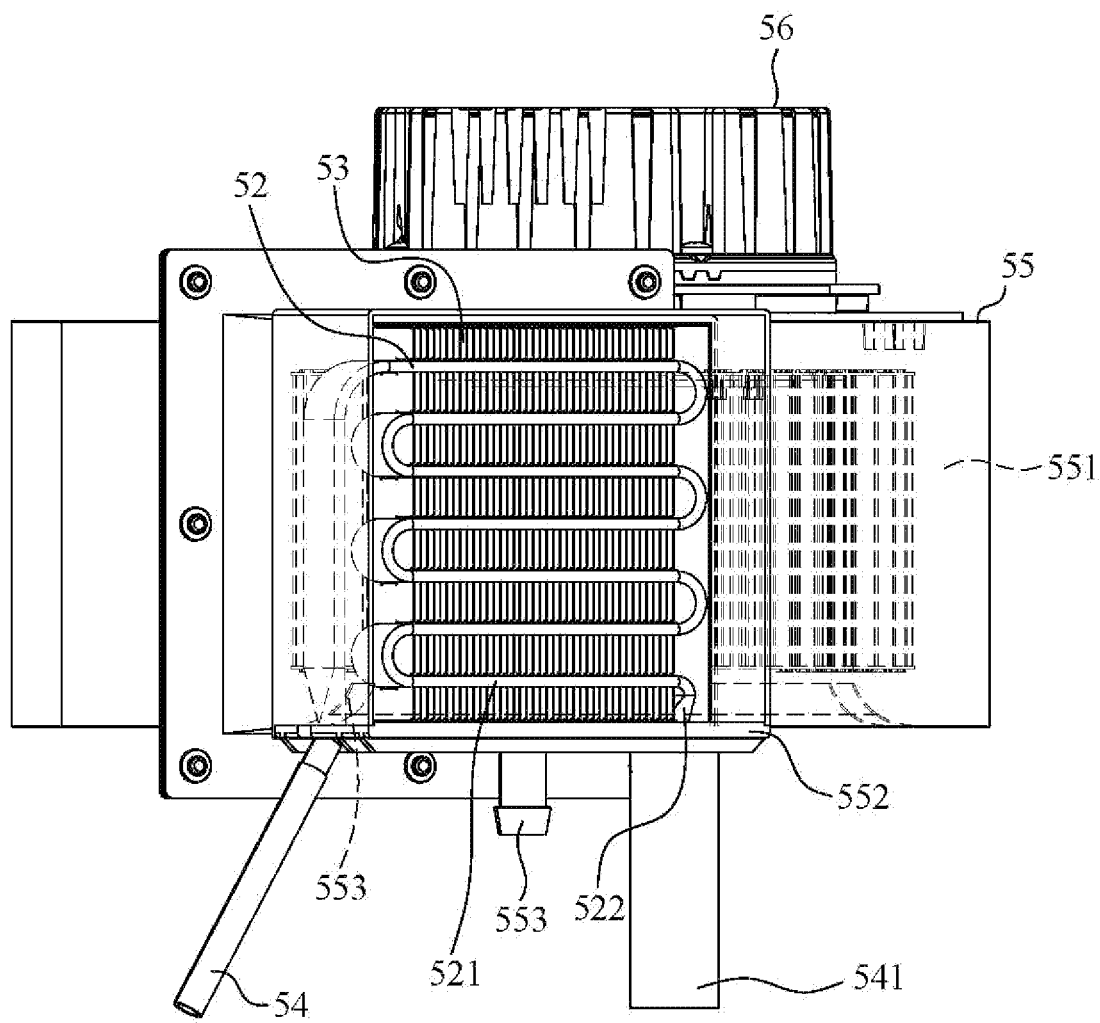
FIG. 9 is a perspective view illustrating a device of application of the cold surface of TEC chip according to another embodiment of the present invention.

FIG. 9 is a transparent perspective view illustrating a device of application of the cold surface of TEC chip according to another embodiment of the present invention. As shown in FIGS. 4, 6B and 9, a device of application of the cold surface of TEC chip 5 includes the cooling part 41, the plate coil 52, the fins 53, the pump (not shown), the reservoir (not shown), a pipeline 54, and further includes a container 55 and a fan 56, wherein the pipeline 54 communicates with the cooling part 41, the plate coil 52, the pump and the reservoir (not shown), the pipeline 54 connected to the first liquid outlet 4113 of the box 411 and the second liquid inlet 522 of the plate coil 52 is wrapped with a thermal insulation material 541, the container 55 has an air inlet area 551, an air outlet area 552 and a discharge joint 553, the fan 56 is disposed in the air inlet area 551, the air inlet of the air inlet area 551 can be equipped with filter (not shown) for filtering particles in the air, the plate coil 52 is disposed between the air inlet area 551 and the air outlet area 552, the discharge joint 553 is located below the plate coil 52.

In this embodiment, the flat tube 521 of the plate coil 52 is extended from the second liquid inlet 522 along the opposite direction of gravity to the highest position, then the flat tube 521 of the plate coil 52 is bended in the direction of gravity to the second liquid outlet 523, the second liquid inlet 522 and the second liquid outlet 523 are both located on a lower side of the plate coil 52 along the direction of gravity, the flat tube 521 in the opposite direction of gravity embedded in the fins 53; the box 55 can be made of engineering plastics (ABS, PC, PC add ABS), all of the flat tube 521 and the fins 53 are exposed to the vertical section of the air flow channel between the air inlet area 551 and the air outlet area 552, for fully heat exchange of the antifreeze with the air introduced by the fan 56; the blower fan can be chosen as the fans 56 to reduce noise.

It is noted that the inlet hole of the reservoir is connected to the second liquid outlet 523 of the plate coil 52, the outlet hole of the reservoir is connected to the pump and the first liquid inlet 4112 of the box 411 which is located on the lower side along the gravity direction, the first liquid outlet 4113 of the box 411 which is located on the upper side along the gravity direction is connected to the second liquid inlet 522 of the plate coil 52 which is located on the lower side along the gravity direction; therefore, the reservoir and the box 411 are usually provided at the lower side of the plate coil 52 along the gravity direction, the second liquid outlet 523 of the plate coil 52 is located on the lower side of the gravity direction, thereby the length of the pipeline 54 connecting the second liquid outlet 523 to the inlet hole of the reservoir can be reduced, reducing the length of the pipeline 54 also reduces the volume of antifreeze loaded outside of the S-turn flow channel 4114 of the box 411. When the volume of the low temperature antifreeze in the S-turn flow channel 4114 is larger than the volume of the antifreeze outside the S-turn flow path 4114 and the heat exchange efficiency of the box 411 is not smaller than the heat exchange efficiency of the plate coil 52 and the fins 53, the device of application of the cold surface of TEC chip 5 can generate low temperature cold air for a long time.

In summary, the device of application of the cold surface of TEC chip of the present invention significantly increases the heat exchange area of the box and plate coil and has excellent thermal conductivity, when the TEC chips start to operate, the coldness of the cold surface of the TEC chips can be immediately conducted. Compared with the prior art, the device of application of the cold surface of TEC chip of the present invention does not require to use a pre-cooling tank, thereby significantly reducing the antifreeze use amount and the circulating pipeline which easily cause coldness loss, the cooling performance thereof meets the standards of products such as vehicle air conditioners, elevator air conditioners, beauty equipment, mobile refrigerators, vaccine storage boxes, and organ storage boxes, so that the device of the present invention has extremely high industrial availability.

The above embodiments are merely illustratively illustrative of the principles of the present invention and its effects, and are not intended to limit the present invention. The above embodiments may be modified, combined and altered by anyone skilled in the art, without departing from the spirit and scope of the invention. Therefore, all equivalent modifications, combinations or alterations made by anyone skilled in the art without departing from the spirit and technical principles disclosed by the present invention shall remain within the following claim of the present invention.

What is claimed is:

1. A device of application of a cold surface of a thermoelectric cooling (TEC) chip, comprising:
  a cooling part, comprising a box, partition plates and an auxiliary cooling structure, wherein the box has sidewalls, a first liquid inlet and a first liquid outlet, an outer surface of the sidewalls is adapted to connect to a cold surface of a TEC chip, the partition plates are arranged in the box and have passages, the passages of the two adjacent partition plates are located on opposite two inner surfaces of the sidewalls to form an S-turn flow channel between the partition plates, the auxiliary cooling structure has a continuous phase framework and pores;
  a plate coil, comprising a flat tube, a second liquid inlet and a second liquid outlet respectively connected to two ends of the flat tube;
  a pump and a reservoir, disposed between the second liquid outlet and the first liquid inlet;
  a pipeline, communicating with the reservoir, the pump, the first liquid inlet, the first liquid outlet, the second liquid inlet and the second liquid outlet, for the pump to transfer an antifreeze to circulate through the box, the plate coil and the reservoir; and
  a thermal insulation structure, which is a frame with two-sided horizontal openings, and upper and lower parts of the insulating structure are formed with grooves which may allow the first liquid outlet and the first liquid inlet to be embedded therein,
  in four sidewalls of the box, the positions of two sidewalls connected to TEC chips are aligned with the positions of the openings of the thermal insulation structure, two sidewalls not connected to the TEC chips are covered by the thermal insulation structure;

wherein, when the device starts operation, the reservoir is used to discharge an air within the box and the plate coil; and wherein, an additional amount of the antifreeze can be added into the reservoir for the pump accelerating the circulation.

2. The device of application of the cold surface of the TEC chip according to claim 1, wherein the first liquid outlet and the first liquid inlet are located on an upper side and a lower side of the box along a direction of gravity.

3. The device of application of the cold surface of the TEC chip according to claim 1, wherein the pores accounts for 70% to 90% of volume of the auxiliary cooling structure.

4. The device of application of the cold surface of the TEC chip according to claim 1, wherein protruding strips are formed on the inner surfaces of the sidewalls, and the auxiliary cooling structure is connected to the protruding strips.

5. The device of application of the cold surface of the TEC chip according to claim 1, wherein the second liquid inlet is located on a lower side of the plate coil along a direction of gravity.

6. The device of application of the cold surface of the TEC chip according to claim 1, wherein a capacity of the box to load the antifreeze is greater than a capacity of the plate coil, the pipeline and the reservoir to load the antifreeze.

7. The device of application of the cold surface of the TEC chip according to claim 1, wherein a volume of the reservoir is not greater than 200 milliliter.

8. The device of application of the cold surface of the TEC chip according to claim 1, wherein the pump and the reservoir has an inlet hole and an outlet hole respectively, the outlet hole of the reservoir is embedded in the inlet hole of the pump, the outlet hole of the pump communicates with the first liquid inlet of the box through the pipeline, the first liquid outlet of the box communicates with the second liquid inlet of the plate coil through the pipeline, the second liquid out let of the plate coil communicates with the inlet hole of the reservoir through the pipeline.

9. The device of application of the cold surface of the TEC chip according to claim 1, further comprising fins, connected to the flat tube.

10. The device of application of the cold surface of the TEC chip according to claim 1, further comprising a container and a fan, wherein the container has an air inlet area and an air outlet area, the fan is disposed in the air inlet area, and the plate coil is disposed between the air inlet area and the air outlet area.

* * * * *